United States Patent
Kaneda et al.

(10) Patent No.: US 9,325,056 B2
(45) Date of Patent: Apr. 26, 2016

(54) RADIATION EFFICIENT INTEGRATED ANTENNA

(75) Inventors: Noriaki Kaneda, Westfield, NJ (US); Nagesh Basavanhally, Skillman, NJ (US); Yves Baeyens, Stirling, NJ (US); Young-Kai Chen, Berkeley Heights, NJ (US); Shahriar Shahramian, Chatham, NJ (US)

(73) Assignee: Alcatel Lucent, Boulogne-Billancourt (FR)

( * ) Notice: Subject to any disclaimer, the term of this patent is extended or adjusted under 35 U.S.C. 154(b) by 623 days.

(21) Appl. No.: 13/609,388

(22) Filed: Sep. 11, 2012

(65) Prior Publication Data

US 2014/0070999 A1 Mar. 13, 2014

(51) Int. Cl.
*H01Q 1/38* (2006.01)
*H01L 21/98* (2006.01)
*H01Q 1/22* (2006.01)
*H01Q 9/04* (2006.01)
*H01Q 23/00* (2006.01)
*H01L 23/00* (2006.01)
*H01L 23/66* (2006.01)

(52) U.S. Cl.
CPC .............. *H01Q 1/2283* (2013.01); *H01L 23/66* (2013.01); *H01L 24/14* (2013.01); *H01Q 9/0435* (2013.01); *H01Q 23/00* (2013.01); *H01L 24/13* (2013.01); *H01L 24/16* (2013.01); *H01L 2223/6677* (2013.01); *H01L 2224/13101* (2013.01); *H01L 2224/16225* (2013.01); *H01L 2924/10253* (2013.01); *H01L 2924/12042* (2013.01); *H01L 2924/351* (2013.01)

(58) Field of Classification Search
CPC .... H01Q 1/2283; H01Q 9/0435; H01Q 23/00
See application file for complete search history.

(56) References Cited

U.S. PATENT DOCUMENTS

| | | | | |
|---|---|---|---|---|
| 2001/0052645 A1* | 12/2001 | Op'T Eynde | ..... | H01L 23/49855 257/700 |
| 2004/0012527 A1* | 1/2004 | Yuanzhu | ................ | 343/700 MS |
| 2006/0049995 A1* | 3/2006 | Imaoka et al. | ................ | 343/702 |
| 2007/0231962 A1 | 10/2007 | Fujii | | |
| 2009/0168367 A1 | 7/2009 | Fujii | | |
| 2011/0018657 A1* | 1/2011 | Cheng et al. | ................... | 333/239 |

(Continued)

FOREIGN PATENT DOCUMENTS

DE 102010028265 A1 10/2011
EP 2469592 A1 6/2012

(Continued)

OTHER PUBLICATIONS

Thompson, Dane C., et al., "Packaging of MMICs in Multilayer LCP Substrates", IEEE Microwave and Wireless Components Letters, vol. 16, No. 7, Jul. 2006, pp. 410-412.

(Continued)

*Primary Examiner* — Hoang V Nguyen
*Assistant Examiner* — Michael Bouizza
(74) *Attorney, Agent, or Firm* — Hitt Gaines, PC

(57) ABSTRACT

An apparatus includes a dielectric slab having first and opposing second major surfaces. A planar antenna element is located on the first major surface. A via formed through the dielectric slab is conductively connected to the antenna element. A plurality of solder bump pads is located on the second major surface and is configured to attach the dielectric slab to an integrated circuit.

16 Claims, 9 Drawing Sheets

(56) References Cited

U.S. PATENT DOCUMENTS

2011/0279335 A1* 11/2011 Degen et al. ........... 343/700 MS
2012/0074559 A1* 3/2012 Budell .................. H01L 23/055
                       257/699

FOREIGN PATENT DOCUMENTS

JP    2002100698    4/2002
WO   2010036709 A2   4/2010

OTHER PUBLICATIONS

Wang, Xuefeng, et al., Liquid Crystal Polymer (LCP) for MEMS: processes and applications, Institute of Physics Publishing, Journal of Micromechanics and Microengineering 13 (2003); pp. 628-633.

An, H., et al., "Broadband Active Circularly Polarized Microstrip Antennas", published Jun. 9, 1993; 3 pages.

PCT International Search Report and Written Opinion for International Application No. PCT/US2013/058420; date of mailing, Dec. 3, 2013; 15 pages.

* cited by examiner

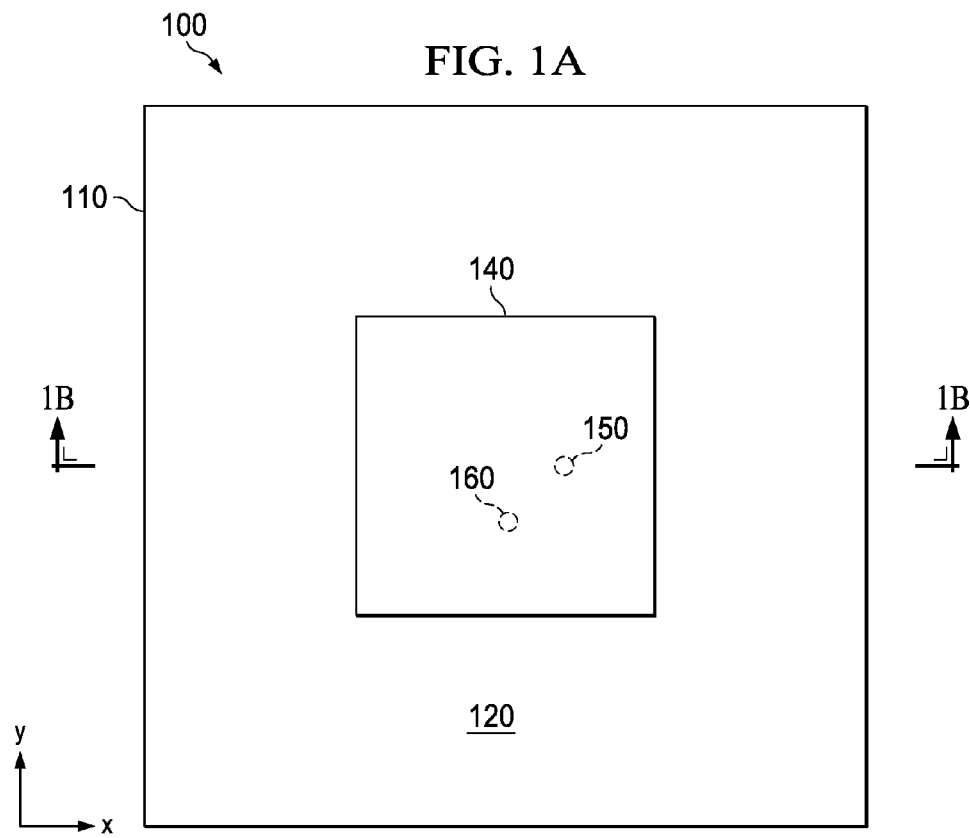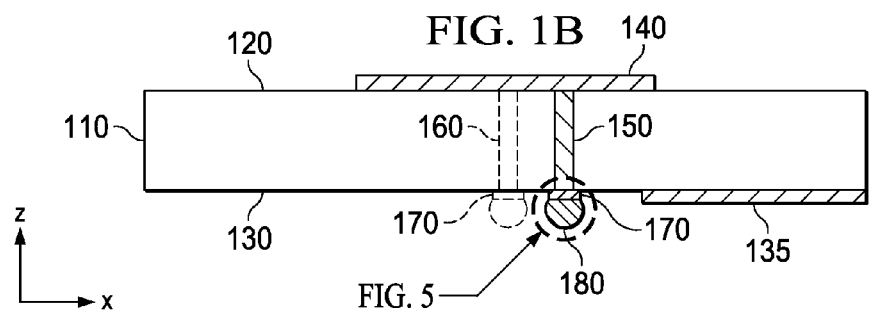

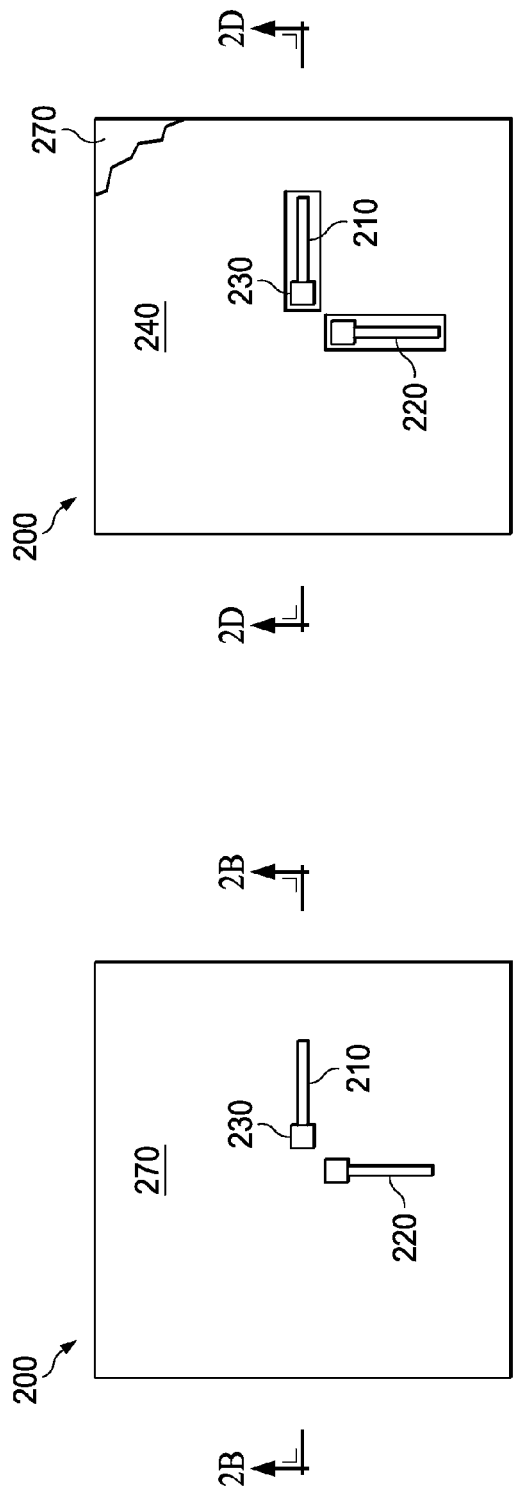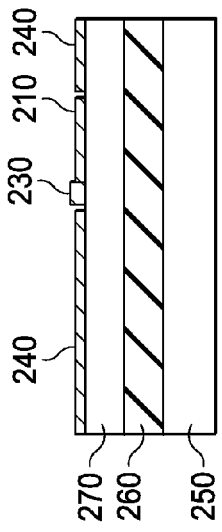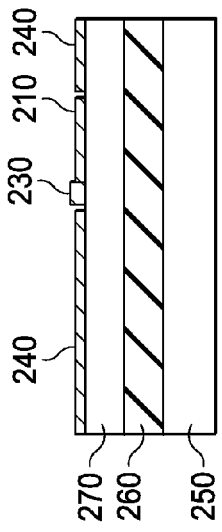

RADIATION EFFICIENT INTEGRATED ANTENNA

TECHNICAL FIELD

This application is directed, in general, to an apparatus including an antenna, and methods of making the same.

BACKGROUND

This section introduces aspects that may be helpful to facilitating a better understanding of the inventions. Accordingly, the statements of this section are to be read in this light and are not to be understood as admissions about what is in the prior art or what is not in the prior art.

Integrating an antenna with a silicon-base electronic device (e.g. integrated circuit, or IC) presents significant challenges to antenna design. High permittivity and high loss of the silicon substrate are unfavorable to efficient high frequency transmission and reception from such antenna elements. It is therefore desirable to reduce the effect of the silicon substrate on the antenna performance.

SUMMARY

One aspect provides an apparatus, e.g. an antenna. The apparatus includes a dielectric slab having first and opposing second major surfaces. A planar antenna element is located on the first major surface. A via formed through the dielectric slab is conductively connected to the antenna element. A plurality of solder bump pads is located on the second major surface and is configured to attach the dielectric slab to an integrated circuit.

Another aspect provides a method, e.g. for forming an antenna. The method includes forming a planar antenna element on a first major surface of a dielectric slab. A via is located within the dielectric slab and conductively connected to the antenna element. A plurality of solder bump pads is formed on the second major surface. The bump pads are configured to attach the dielectric slab to an integrated circuit.

In any of the above-described embodiments the integrated circuit may be joined to the dielectric slab using the solder bump pads. In any such embodiment, the apparatus may include an antenna feed line located on the integrated circuit and connected to the antenna element by the via. In any such embodiment, a plurality of grounded bumps may be located adjacent the antenna feed line.

In any of the above-described embodiments the apparatus may include a substantially uninterrupted ground plane located on top level metal of the IC. In any embodiment the apparatus may further include a carrier substrate joined to the first major surface via an adhesion layer.

In any embodiment the apparatus may further include a second via formed through the dielectric slab and conductively connected to the antenna element. The first via may be located offset from a geometric center of the antenna element and about on a first axis of the antenna element. The second via may be located offset from the geometric center of the antenna element and about on a second orthogonal axis of the antenna element. In any such embodiment the antenna element may be configured to radiate two orthogonal linearly polarized modes. In various embodiments the antenna element is configured to produce circular polarized radiation.

In any of the above-described embodiments the dielectric slab may comprise a liquid crystal polymer. In any embodiment the via may have has an aspect ratio of at least about 2:1. In any embodiment the dielectric slab may have a thickness of about 100 µm. In any of the above-described embodiments the via or vias may be formed by laser ablation of the dielectric slab.

BRIEF DESCRIPTION

Reference is now made to the following descriptions taken in conjunction with the accompanying drawings, in which:

FIGS. 1A and 1B respectively illustrate plan and sectional views of one example embodiment of an apparatus, e.g. an antenna, including a dielectric slab, a planar antenna element and two vias located within the slab and conductively connected to the antenna element;

FIGS. 2A-2D illustrate an example embodiment of an integrated circuit (IC) that include antenna feed lines configured to carry antenna signals to each of the vias of FIG. 1, wherein FIGS. 2A and 2B illustrate plan and sectional views of the IC without a ground plane and FIGS. 2C and 2D illustrate plan and sectional views of the IC with a ground plane;

Figure 8A:
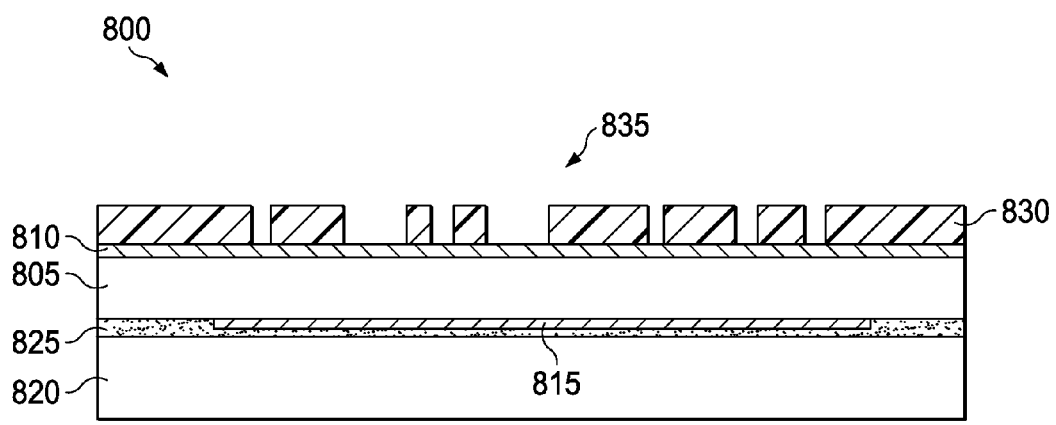
FIGS. 8A-8G illustrate aspects of the fabrication of an antenna formed according to various embodiments.
Figure 8B:
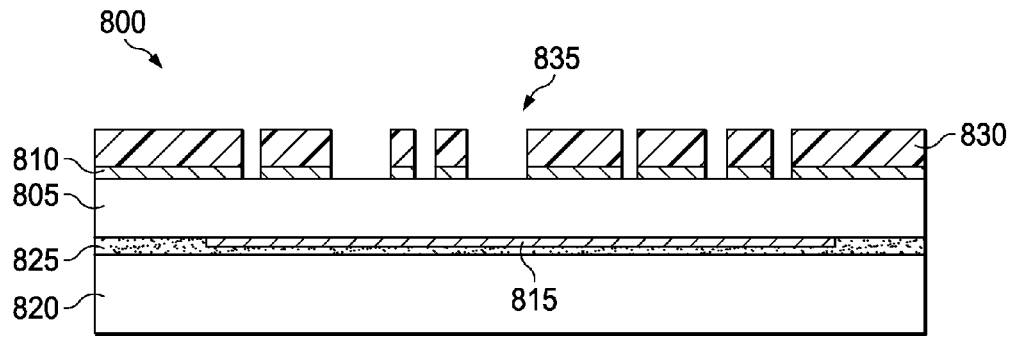
Figure 8C:
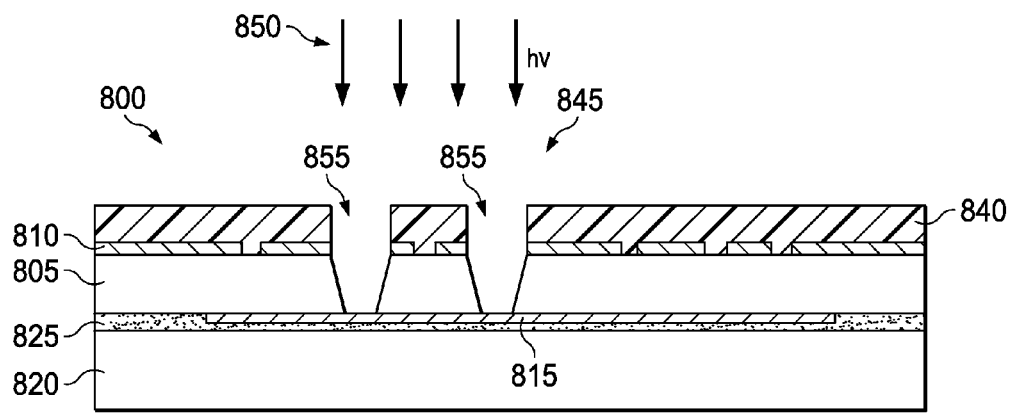
Figure 8D:
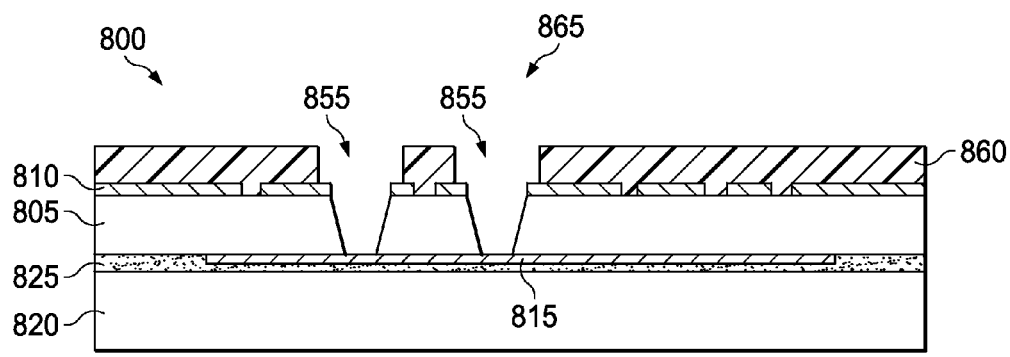
Figure 8E:
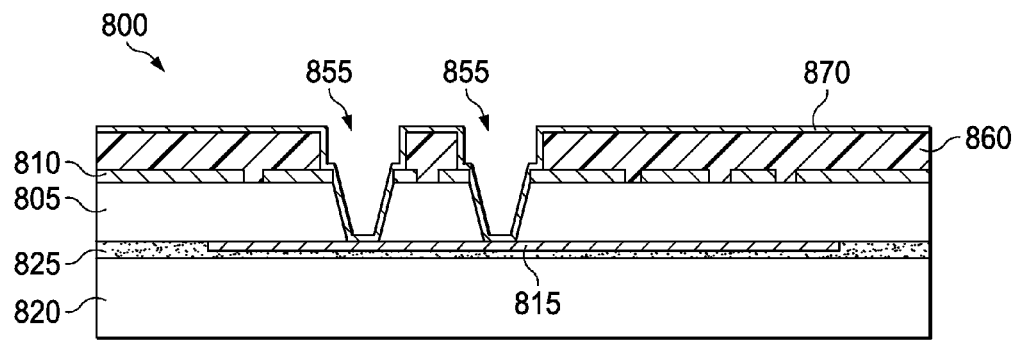
Figure 8F:
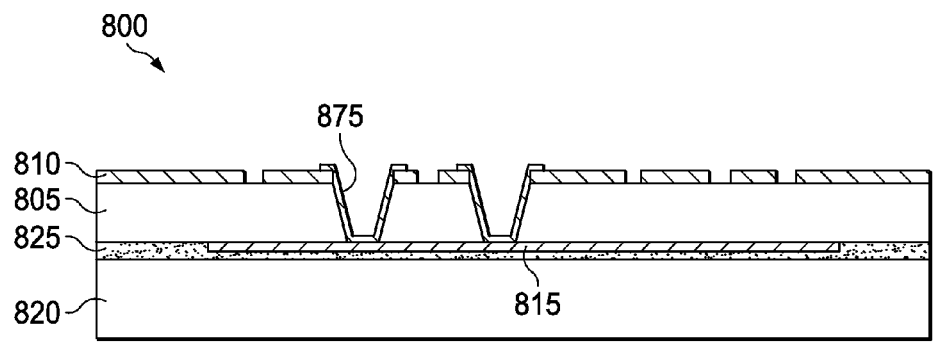
Figure 8G:
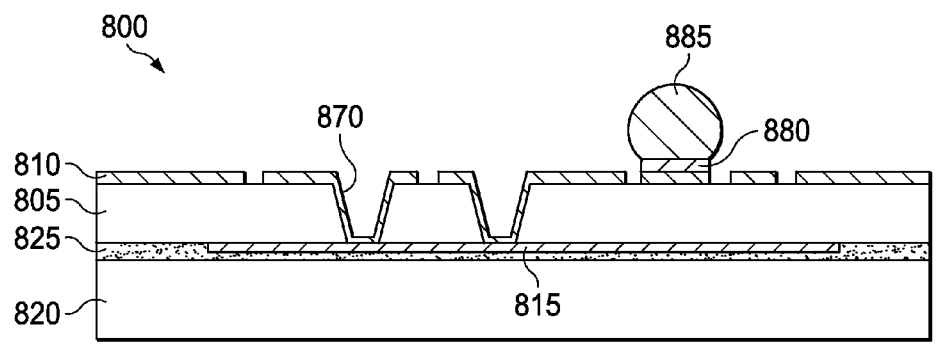
Figure 9:
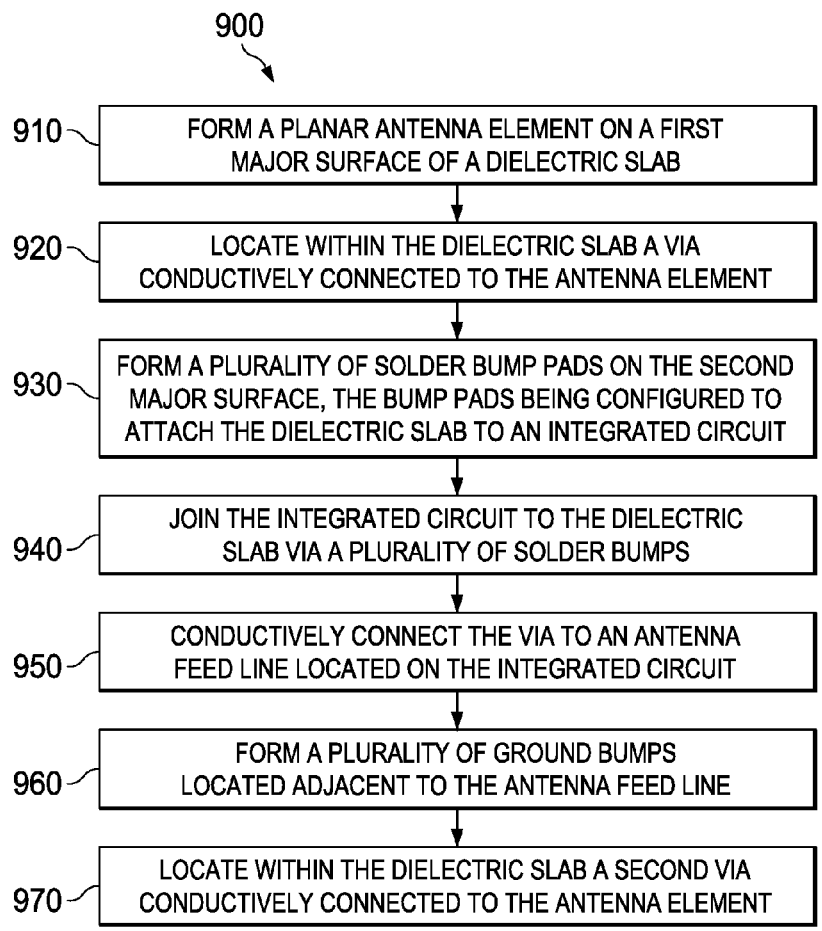
Figure 10:
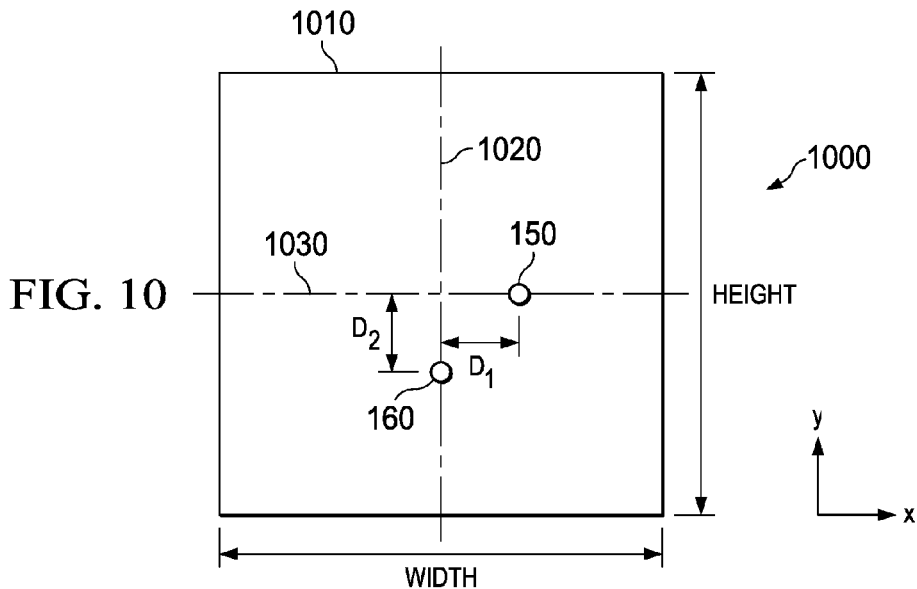

FIG. 9 presents a method, e.g. for manufacturing an apparatus according to various embodiments as described by, e.g. FIGS. 1, 2A-2D, 3A-3B, 4, 5A-5C, 6 and 8A-8G; and FIG. 10 illustrates aspects of placement of vias in the antenna of FIG. 1, according to one embodiment.

DETAILED DESCRIPTION

Many integrated circuits ("ICs") include relatively thick metal and dielectric layers at the top of the metallization stack. However, these layers are still too thin (e.g. about 10 µm) to form a radiation-efficient high-frequency antenna. It is thought that this result is due to the tendency of the relatively thin substrate to support a high concentration of the electrical field. Some attempts have been made to form an antenna on a low-loss substrate, and then to couple the antenna to the IC via electromagnetic (EM) coupling. However, the reported efficiency of such efforts is typically only 50~57% resulting in the loss of ~3 dB in antenna gain.

The inventor has determined that some limitations of conventional integrated IC-antenna systems may be overcome by using a novel integrated antenna structure using a relatively thick low-loss substrate and coupling current between the IC and the antenna element. It is believed that this approach may result in antenna efficiency of at least about 90%. In some cases such an antenna element may also support orthogonal polarization modes, providing transmission and reception via two nominally orthogonal channels.

FIGS. 1A and 1B illustrate without limitation aspects of a first example embodiment of an antenna 100 according to principles of the invention. FIG. 1A provides a plan view of the antenna 100, while FIG. 1B provides a side view through a section of the antenna 100 as marked. These figures are referenced simultaneously in the following discussion.

The antenna 100 includes a substrate 110, e.g. a dielectric slab, with respective first and second major surfaces 120 and 130. A microstrip patch 140 is located on the first major surface 120. Vias 150 and 160 provide conductive coupling from the surface 130 side of the substrate 110 through the substrate 110 to the patch 140. As described further below the vias 150 and 160 may be located relative to the patch 140 such that each may couple an excitation signal to a different radiating mode of the patch 140. Bump pads 170 provides a connection to the vias 150 and 160. Solder connections 180, sometime referred to herein as solder bumps 180, provide solderable connections to the bump pads 170. The surface 130 in the illustrated embodiment is essentially clear of metal features, with the exception of the bump pads 170. In other embodiments, not pictured, the surface 130 may include metal features such as a partial or substantially complete ground plane 135 that may include openings suitable to allow for signal vias to pass therethrough. The illustrated ground plane 135 is included for illustration, and does not limit the ground plane 135 to any particular configuration.

The substrate 110 may be formed from any suitable dielectric material. It may be preferable that the substrate 110 have low dielectric permittivity, e.g. about 4 or less, and a low loss coefficient, e.g. about 0.01 or less. In one nonlimiting example the substrate 110 is formed from quartz or an organic dielectric. Fused quartz, for example, may have a dielectric constant of about 3.75 and a loss coefficient of about 0.0004 or less. Moreover, it may be preferable that the substrate 110 be thick enough that it is mechanically strong enough to withstand handling during the fabrication process. In some embodiments, e.g., the substrate 110 has a thickness within a range from about 100 μm to about 150 μm, sometimes preferably about 125 μm.

The patch 140 and the bump pad 170 may be formed from copper, but are not limited to any particular metal. In some embodiments, as described further below, the substrate 110 may be supplied with metal layers laminated to the surfaces 120 and 130. The laminated layers may then be patterned to form the desired metal features, e.g. the patch 140 and the bump pads 170. In some embodiments the patch 140 and the bump pads 170 have a same thickness, though embodiments are not limited to such cases. The thickness of the patch 140 and the bump pads 170 is not limited to any particular value. In some embodiments the thickness may be several microns, e.g. about 20 μm.

FIGS. 2A-2D illustrate embodiments of an integrated circuit (IC) 200 configured to operate in cooperation with the antenna 100. The IC 200 may include functionality to drive the patch 140 with one or more excitation signals. The antenna 100 may be mated to the IC 200 using the solder bump 180 and other solder bumps as described below.

FIGS. 2A and 2B illustrate one embodiment of the IC 200 in plan (FIG. 2A) and sectional (FIG. 2B) views. The IC 200 includes a semiconductor (e.g. silicon) substrate 250, a functional layer 260 (e.g. transistors and interconnects), and a dielectric layer 270 overlying the functional layer 260. First and second antenna feed lines 210 and 220 may provide excitation signals to the solder bumps 180. For example, the antenna 100 may be attached to the IC 200 using a solder reflow process, e.g. a so-called "flip-chip" process. Such processes are well known to those skilled in the pertinent art, e.g. IC device packaging. The excitation signal may be provided to the feed lines 210 and 220 by a lower signal level of the IC 200, e.g. from within the functional layer 260. Each of the feed lines 210, 220 may include a solder pad 230 configured to form a solder connection with a corresponding one of the bump pads 170. The pads 230 may include a suitable UBM stack, e.g. Ti/Pt/Au, to provide a robust connection to the solder bumps 180.

As known to those skilled in the art, an IC may have multiple metal levels in which signal traces and/or power distribution nets are formed. While in principle any of these metal levels may be used to provide the excitation signal to the patch 140, it may be advantageous to locate the feed lines 210 and 220 at the top level, in part because the metal thickness is often greater at the top level than some lower levels, and in part because the excitation signals might interfere with some aspects of operation of the IC 200 if embedded among signal lines at lower levels. Thus the feed lines 210 and 220 may be formed in the top level metal layer of the IC 200, e.g. over the dielectric layer 270, but embodiments are not limited thereto.

FIGS. 2C and 2D illustrate another one embodiment of the IC 200 in plan (FIG. 2C) and sectional (FIG. 2D) views. In this embodiment the IC 200 includes a ground plane 240. The ground plane 240 may be formed from the top metal level of the IC 200. In some cases the ground plane 240 may be formed from a lower-level metal layer. The ground plane may operate to electromagnetically isolate the IC 200 from the patch 140, and to provide attachment points for the antenna 100. For example, the ground plane 240 may include a number of locations at which UBM stacks are formed. These locations may serve as bonding points for solder connections in a flip-chip process. This aspect is developed in greater detail below. In various embodiments the ground plane is substantially uninterrupted, e.g. is continuous and unbroken, with the exception of portions removed to accommodate the feed lines 210, 220 and the pads 230.

Figure 3A:
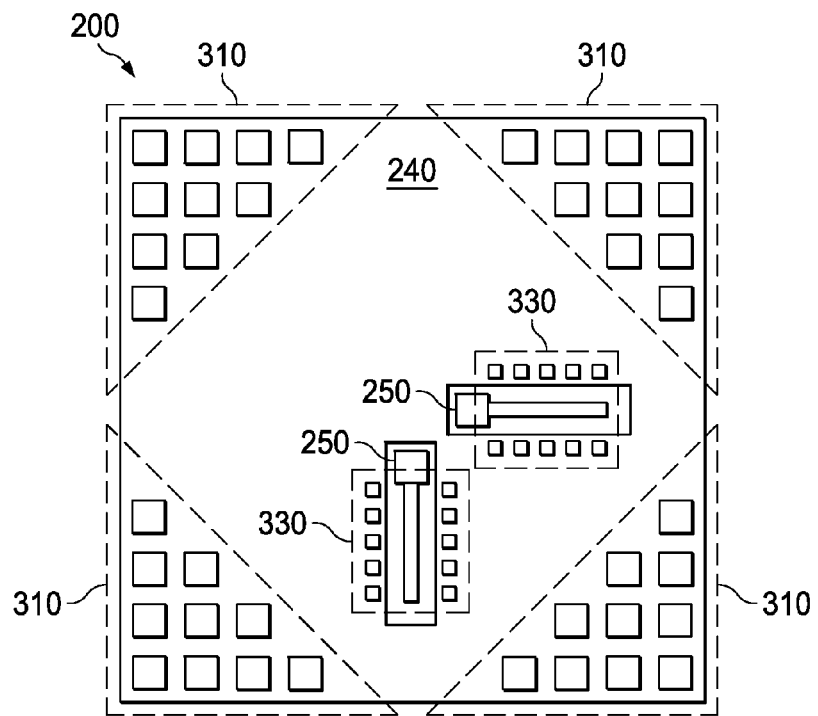
FIGS. 3A and 3B illustrate plan views of an example embodiment of an IC (FIG. 3A) and an antenna (FIG. 3B), showing solder bump pads located to attach the antenna to the IC, and an optional ground plane located on the IC.
Figure 3B:
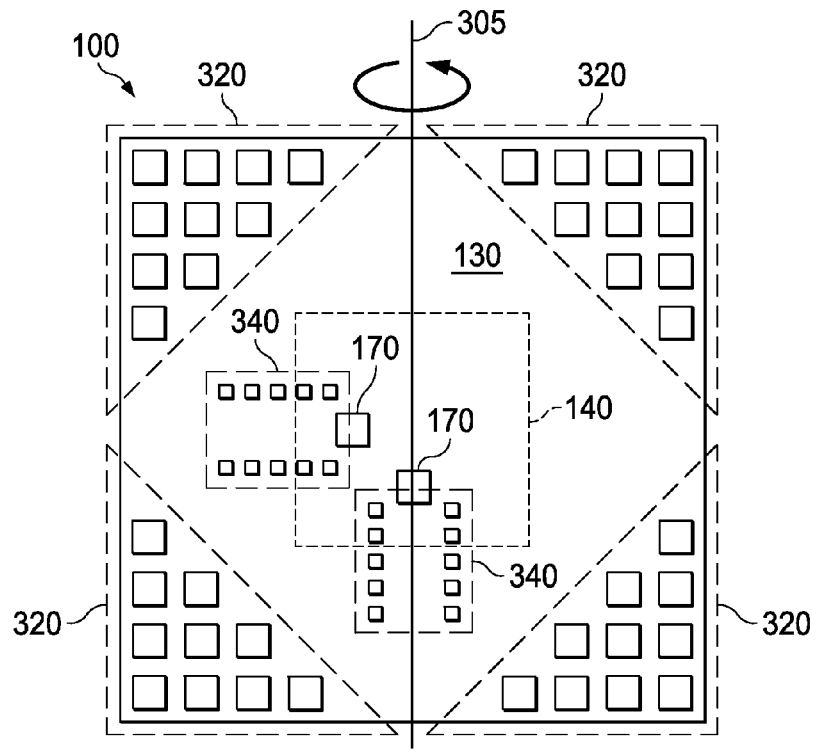
Figure 4:
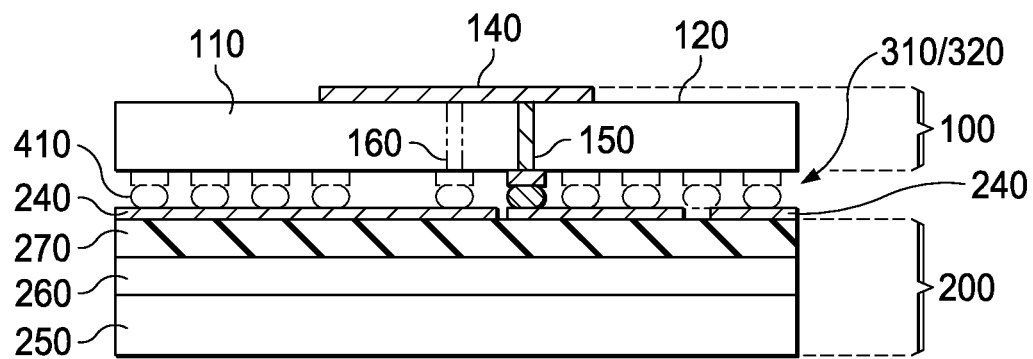
FIG. 4 illustrates an example embodiment of an antenna, e.g. the antenna of FIG. 3B, connected to an IC, e.g. the IC of FIG. 3A.

FIGS. 3A and 3B respectively illustrate a plan view of the IC 200 and the antenna 100. The FIG. 3B illustrates the antenna 100 with the second major surface 130 facing up in the view of the figure. The IC 200 and the antenna 100 are configured such that the antenna 100 may be rotated about an axis of rotation 305, placed over the IC 200, and joined by, e.g. a flip-chip process. FIG. 4 illustrates the combined IC 200 and antenna 100. FIGS. 3A, 3B and 4 are described concurrently in the following discussion.

The IC 200 includes solder bump pads 310. The antenna 100 includes bump pads 320. The arrangement of the bump pads 310 and 320 is not limited to any particular arrangement. It may be desirable to place a sufficient number of bump pads 310 to mechanically support the antenna 100 in all anticipated operating environments, and to accommodate any thermal stresses caused by thermal expansion coefficient mismatch. Solder bumps 410 (FIG. 4) located between the aligned pads 310 and 320 form after reflow a conductive electrical and a mechanical connection between the antenna 100 and the IC 200. Bump pads 250 are also aligned with the bump pads 170. Thus, some solder bumps 410 may conductively connect the bump pads 170 and 250 to couple an excitation signal produced by the IC 200 to the patch 140 through the vias 150 and 160.

Some embodiments include bump pads 330 located in the IC 200 and bump pads 340 located on the antenna 100. The bump pads 330 and 340 may also be aligned such that the solder bumps 410 may be formed therebetween. As described below with respect to FIGS. 5A-5C, these solder bumps may suppress the excitation of parallel plate modes between the IC 200 and the antenna 100.

Figure 5:
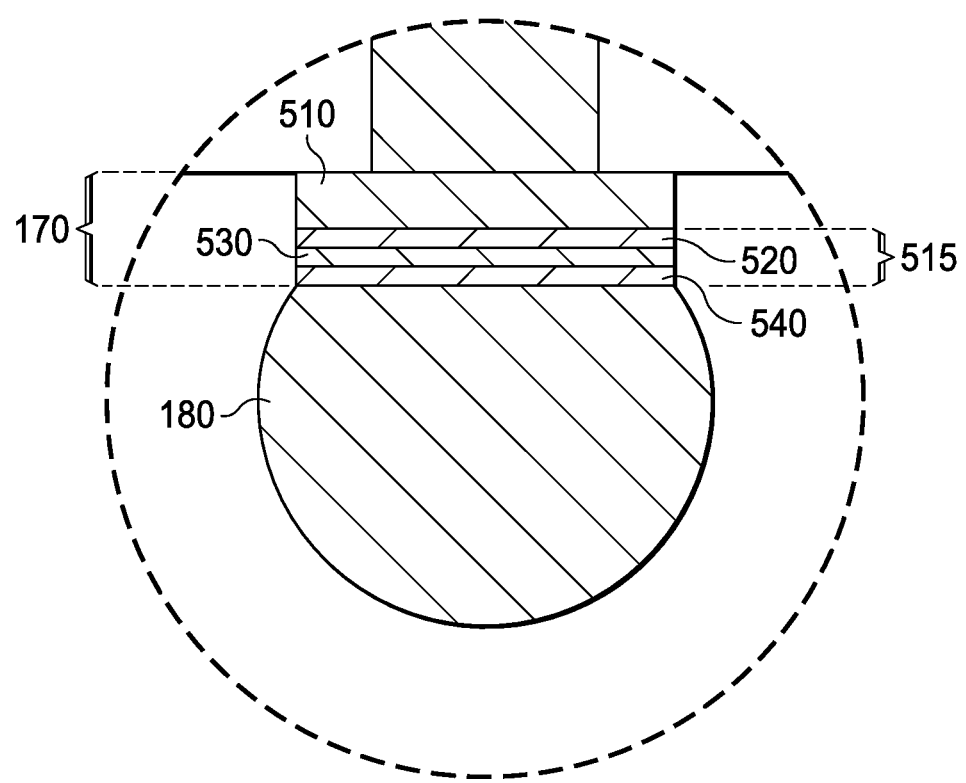
FIG. 5 illustrates a detail sectional view of a portion of FIG. 1 showing one embodiment of a solder bump pad, solder bump, and under-bump metallization (UBM) located therebetween.

FIG. 5 illustrates a detail of the bump pad 170 and the solder bump 180. The illustrated configuration is representative of an embodiment that may describe any of bump pads 170, 250, 310, 320, 330 or 340. The bump pad 170 may include a copper core 510 and an under-bump metallization (UBM) 515 that includes layers 520, 530 and 540. The layer 520 may be, e.g. a Ti or Cr layer, the layer 530 may be, e.g. Pt layer, and the layer 540 may be, e.g. an Au layer. In some embodiments the top level metal of the IC 200 may be a metal other than copper. In such cases the UBM 515 may be altered as appropriate. Moreover, those skilled in the pertinent art will appreciate that other UBM schemes are possible and may include layers having different compositions than the described embodiment, or may have a different number of layers.

The solder bump 180 is located on the outermost UBM layer, e.g. the layer 540. The solder bump is not limited to any particular composition, and may be any conventional or future-discovered solder composition. In some embodiments it may be desirable to use a Pb-free composition, e.g. a tin-silver-copper solder, sometimes referred to as a SAC solder.

Figure 6A:
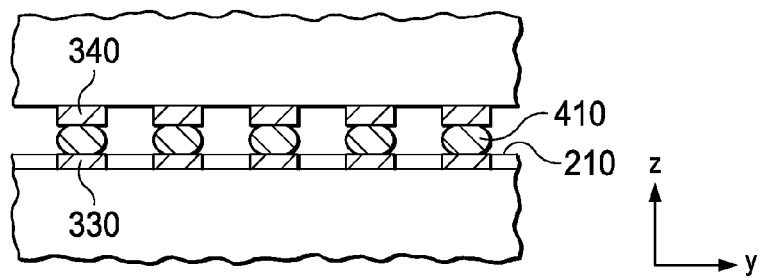
FIGS. 6A-6C illustrate sectional (FIGS. 6A and 6B) and plan (FIG. 6C) views of an antenna feed line, e.g. such as shown in FIG. 2A, and solder bumps located to suppress parallel mode excitation between the antenna and the IC.
Figure 6B:
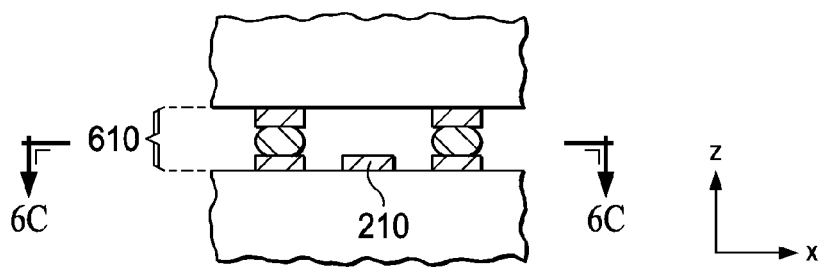
Figure 6C:
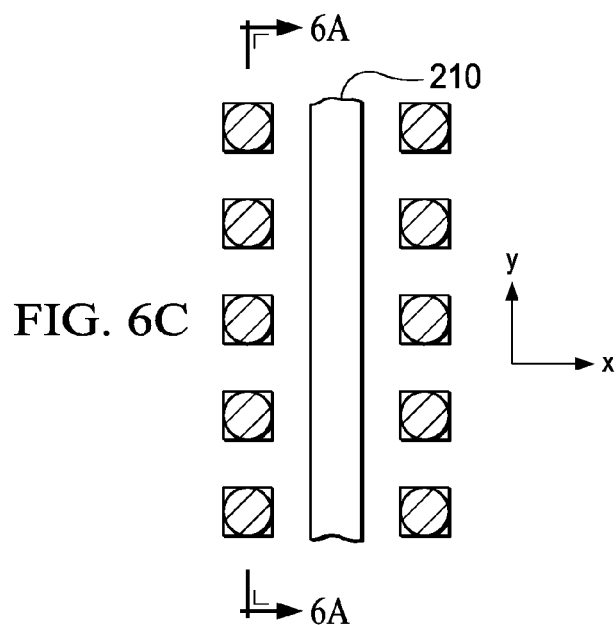

FIG. 6 illustrates sectional (FIGS. 6A and 6B) and plan (FIG. 6C) views of an antenna feed line, e.g. the antenna feed line 210, solder bump pads, e.g. the bump pads 330 and 340, and solder bumps, e.g. the solder bumps 410. The bump pads 330 and 340, and the solder bumps 410 form an assembly 610 referenced for brevity in the following discussion. Multiple instances of the assembly 610 may be located adjacent to and on both sides of the antenna feed line 210. Optionally the assemblies 610 are grounded by a ground plane such as the ground plane 240. Herein, "grounded" and similar terms include embodiments in which the bumps are configured to be grounded during operation of the IC, even though the IC may not be actually connected to a ground reference. It is believed that the assemblies 610 are capable of suppressing parallel mode excitation between the patch 140 and the IC 200. Such excitations may be caused by an air gap between the substrate 110 and the ground plane 240. These excitations may be undesirable, as isolation between orthogonal antenna modes may be reduced, and/or antenna power may be reduced as energy is coupled to the parallel mode excitations.

FIG. 10 illustrates a nonlimiting example antenna 1000 according to various embodiments described herein. X-Y coordinate axes are illustrated for reference without limitation. A radiating element 1010, analogous to the patch 140, has a first axis 1020 parallel to the Y-axis and has a second axis 1030 parallel to the X-axis. The element 1010 has a height H and width W. H and W are illustrated as being about equal, but embodiments are not limited thereto. The axes 1020 and 1030 intersect at a geometric center of the element 1010. The via 150 is displaced from the geometric center by an offset $D_1$ in the positive-x direction, and the via 160 is displaced from the geometric center by an offset $D_2$ in the negative-y direction. In the illustrated embodiment $D_1$ is shown to be about equal to $D_2$, but embodiments are not limited thereto.

Performance of the antenna 1000 was modeled according to parameters that describe various aspects of the antenna 1000. The model parameters included, e.g. a quartz substrate 110, H≈740 µm, W≈740 µm, $D_1$≈145 µm, and $D_2$≈145 µm to produce a ~94 GHz center frequency. These values are provided as examples only, and do not limit the geometry of the antenna 100 in any particular aspect.

An excitation signal applied to the via 150 excites an EM emission linearly polarized about parallel to the Y-axis, e.g. Y-polarization, as referenced to the illustrated coordinate axes. An excitation signal applied to the via 160 excites an EM emission linearly polarized about parallel to the X-axis, e.g. x-polarization. Thus the antenna 1000 is capable of radiating in two mutually-orthogonal polarization modes. This orthogonality is representative of various embodiments described herein, e.g. the antenna 100 and the antenna 200. In such embodiments the antenna may be operated to produce circular polarized radiation due to the ability to simultaneously excite two orthogonal linear polarization radiation modes.

Figure 7:
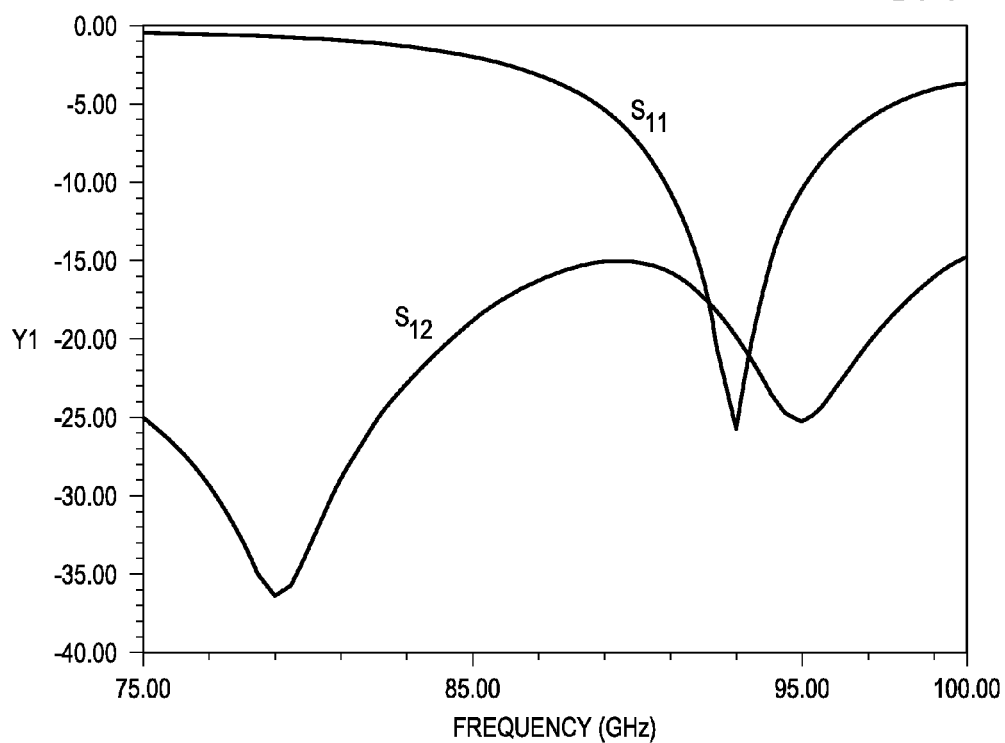
FIG. 7 illustrates s-parameter plots illustrating aspects of the simulated performance of an embodiment of an antenna formed according to the principles described herein, e.g. the antenna of FIG. 3B.

FIG. 7 illustrates an s-parameter plot showing aspects of the simulated performance of the antenna 1000 attached to an IC such as the IC 200. Without limitation to any particular embodiment, the antenna design on which the simulated results of FIG. 7 are based include a top-level metal ground plane on the IC, e.g. the ground plane 240, and solder ball assemblies adjacent the antenna feed line, e.g. the assemblies 610 positioned as shown by the bump pads 330 and 340. A port $S_1$ may describe a first input to the antenna 100, e.g. the via 150. A port $S_2$ may describe a second input to the antenna 100, e.g. the via 160. A first characteristic $S_{11}$ describes the coupling of power input to the port $S_1$ back to the port $S_1$. A second characteristic $S_{12}$ describes the coupling of power input to the port $S_1$ to the port $S_2$. Thus, the $S_{12}$ characteristic may describe the isolation between a first antenna excitation mode and a second orthogonal antenna excitation mode.

The $S_{11}$ characteristic exhibits a minimum at about 94 GHz, e.g. in the W band of the microwave spectrum. The value of the minimum, about −25 dB, represents relatively efficient coupling of power input to the patch 140 to radiation emitted by the antenna 100 at 94 GHz. The $S_{12}$ characteristic exhibits more complex behavior, with two local minima in the displayed frequency range. At 94 GHz, the value of $S_{12}$ is about −20 dB. Thus, in this embodiment the isolation between the two radiating modes of the antenna 100 may be expected to be at least about 20 dB. This degree of isolation is considered to be sufficient to support transmission via the antenna 100 of two mutually orthogonal linearly polarized signals. The parallel plate mode can be supported between the ground plane 135 of the quartz substrate 110 and a metal layer of the IC substrate (e.g. ground plane 240). This mode can be suppressed, e.g. shorted, by conductive connections between the ground planes near the first and second antenna feed lines 210 and 220. The conductive connections are discussed further below.

It is thought that the small cross talk between the X-polarization and Y-polarization is due to conductively exciting the linear polarized modes of the antenna 1000 using the vias 150 and 160 rather than by electromagnetic coupling. This small cross-talk is expected to provide the ability to transmit or receive in two separate orthogonal channels. Moreover, the $S_{11}$ and $S_{12}$ characteristics indicate that an efficiency can be expected of greater than 90% for a passband of about 5% around the 94 GHz center frequency.

FIGS. 8A-8F illustrate a subset of steps that may be used in the fabrication of an antenna such as the antenna 100. Those skilled in the pertinent art will recognize that aspects of the described steps that are omitted are well known to such skilled persons, such as various aspects of semiconductor device fabrication.

FIG. 8A illustrates the antenna 100 at an intermediate stage of fabrication. A substrate 805 has a conductive layer 810 adhered thereto that may be unpatterned. A conductive layer 815 may have been patterned in a preceding step to form one or more metal features, e.g. the patch 140. The substrate 805 comprises a dielectric material suitable for acting as an antenna substrate. It may be desirable that the substrate 805 have a dielectric permittivity no greater than about 4, and a loss coefficient no greater than about 0.01. The substrate 805 is not limited to any particular material, and may comprise inorganic materials, organic materials or both. In a nonlimiting example, the substrate 805 comprises glass, quartz (e.g. fused quartz), a polymeric material, a liquid crystal polymeric material or a thermoset resin.

The layers 810 and 815 are not limited to any particular material, but may be metallic. In a nonlimiting example, the layers 810 and 815 comprise copper, and may be substantially pure layers of elemental copper. In a nonlimiting example, the layers 810 and 815 are substantially pure elemental copper with a thickness of about 18 μm. Without limitation, the substrate 805 and the layers 810 and 815 may be conveniently supplied as a laminate product such as, e.g. Ultralam 3950 laminate, available from Rogers Corporation, Advanced Circuit Materials Division, Chandler Ariz., USA. The Ultralam 3950 product may include a liquid crystalline polymeric material with a thickness of about 100 μm, a dielectric permittivity of about 2.9 and a loss coefficient of about 0.002, and 18 μm laminated copper layers with a sheet resistance of about 1 mΩ/sq. Embodiments using conductive layers 810 and 815 being formed of other materials and/or having a different thickness and/or sheet resistance are expressly recognized as being within the scope of the disclosure.

In the illustrated embodiment the substrate 805, including the layers 810 and 815, are affixed to a carrier substrate 820. The carrier substrate 820, sometimes referred to as the carrier 820, may be any material and have any thickness suitable to support the substrate 805 during processing of the antenna 100. In a nonlimiting embodiment the carrier 820 is a Borofloat® glass wafer. As known to those skilled in the pertinent art, semiconductor processing tools may be configured to accept wafers having a uniform size, e.g. 300 mm diameter. Some processing of the antenna 100 may be carried out using standard semiconductor processing tools using such a wafer as the carrier 820. Suitable wafers may be obtained from, e.g. Schott North America, Louisville, Ky. 40228, USA. However, any substrate that is compatible with such tools may be used, e.g. quartz, sapphire, silicon, or another semiconductor such as GaAs.

The substrate 805 may be affixed to the carrier 820 via a adhesive layer 825. The adhesive layer 825 is not limited to any particular type or material. In some embodiments the adhesive layer 825 is a material that forms a quasi-permanent bond between the layer 815 and the carrier 820. In some embodiments the adhesive layer 825 is formed from a material having a low dielectric permittivity and/or loss coefficient. Without limitation, one convenient material is 3001 bonding film, produced by Rogers Corporation, infra. This material may have, e.g., a dielectric permittivity of about 2.3 or less, and a loss coefficient of about 0.003 or less.

In some embodiments the layer 815 has been processed by a conventional process to form the patch 140 prior to joining the substrate 805 to the carrier 820. Those skilled in the art are familiar with such processing, which may include deposition and patterning of a photoresist layer, and wet or dry chemical etching of the layer 815.

In the illustrated embodiment a photoresist layer 830 has been formed and patterned over the layer 810. The patterning has formed openings 835 that are positioned to form various features in the layer 810 in subsequent processing steps. The features may include, e.g., the bump pads 170, 320 and 340, and a ground plane located on the surface 130 if desired.

FIG. 8B shows the antenna 100 in a later stage of formation, after a wet or dry chemical etch has removed portions of the layer 810 exposed by the openings 835. The etch process is not limited to any particular process, but may be, e.g., a plasma etch process. After the etch process, the photoresist layer 830 may be removed by any conventional process.

FIG. 8C shows the antenna 100 in a later stage of formation, e.g. after a photoresist layer 840 has been formed and patterned to form openings 845. The openings 845 may be located to form the vias 150, 160. In the figure, a process 850 is shown forming openings 855 in the substrate 805. The process 850 may be any suitable process, e.g. a plasma etch process or an optical, e.g. laser, process. As a nonlimiting example, the process 850 may be a laser ablation process. As known by those skilled in the pertinent art, a laser ablation process may use an electromagnetic wavelength that is at least partially absorbed by the layer 805, causing heating and vaporization of exposed portions of the layer 805. In some embodiments the wavelength is selected to produce greater absorption in the substrate 805 than in the photoresist layer 840. The laser ablation process may be capable of producing openings 855 with an aspect ratio of at least about 2:1. Thus, e.g. when the substrate 805 has a thickness of about 100 μm, the diameter of the openings 855 may be about 50 μm or less.

In embodiments using the liquid crystalline polymeric substrate 805, the openings 855 can be formed by, e.g. punching, drilling, $O_2$ plasma etch (e.g. reactive ion etching, or RIE), or laser ablation. Below 100 μm punching and drilling the openings 855 may not be practical. Among RIE and laser ablation, laser ablation may be preferable as a cost effective process. A KrFl 248 nm excimer laser may be used to ablate the openings 855. The layer 815 may act as a stop layer during the excimer laser ablation process. For example, copper may act as an effective stop layer.

In FIG. 8D the photoresist layer 840 has been removed, and a photoresist layer 860 has been formed. Openings 865 expose portions of the layer 810. In some embodiments, the photoresist layer 860 may be formed by processing the photoresist layer 840 to expose portions of the layer 810. For example, an isotropic plasma etch process may remove portions of the photoresist layer 840 to expose portions of the layer 810 as shown.

In FIG. 8E, a conductive layer 870 has been formed over the photoresist layer 860. The conductive layer 870 is not limited to any particular material, but may be, e.g. sputtered gold or aluminum. The conductive layer 870 forms a conductive interface with the exposed portions of the layer 810.

In FIG. 8F the photoresist layer 860 and portions of the conductive layer 870 have been removed. The removal may be done using, e.g., a chemical-mechanical polishing, or a solvent process that dissolved the photoresist layer 860 and lifts off overlying portions of the conductive layer 870. Remaining portions 875 form conductive connections between portions of the layer 810 and the layer 815. Thus, the remaining portions 875 perform the function of the vias 150, 160, providing conductive coupling to the layer 815, e.g. the patch 140.

In FIG. 8G UBM 880 and solder bump 885 have been formed. Processes for forming these features are well known in the art. The UBM 880 may be as described previously with respect to the UBM 515. The solder bump 885 may comprise a Pb-free solder composition such as SAC, as described previously with respect to the solder bump 180. The solder bump 885 may be representative of, e.g. the solder bumps 410.

The carrier 820 may include a plurality of instances of the antenna 100 after completing the process steps illustrated by FIGS. 8A-8G. The carrier 820 may be mated to a substrate that includes a corresponding plurality of instances of the IC 200. Each of the instances of the antenna 100 may be mated to a corresponding instance of the IC 200 using a flip chip process that includes, e.g. a solder reflow process. The multiple instances of the combined antenna 100 and IC 200 may then be separated by, e.g. a wafer saw process, to form multiple instances of the combined antenna 100 and IC 200. Optionally, the separated portions of the carrier 820 may remain attached to the antenna 100. In embodiments as described previously, e.g. when the carrier 820 is a quartz or Borofloat® glass, the carrier 820 is not expected to significantly interfere with the transmission or reception of signals via the antenna 100. Turning to FIG. 9, a method 900 of forming an apparatus, e.g. the antenna 100, is shown. The steps of the method 900 are described without limitation by reference to elements previously described herein, e.g. in FIGS. 1A, 1B, 2A-2D, 3A, 3B, 4, 5, 6A-6C, and 8A-8G. The steps of the method 900 may be performed in another order than the illustrated order, and in some embodiments may be omitted altogether.

In a step 910, a planar antenna element, e.g. the patch 140, is formed on a first major surface of a dielectric slab, e.g. the surface 120 of the substrate 110. In a step 920 a via, e.g. the via 150 or the via 160, is located within the dielectric slab and conductively connected to the antenna element. In a step 930 a plurality of solder bump pads, e.g. the bump pads 170, 320 or 340, are formed on a second major surface of the dielectric slab, e.g. the surface 130. The bump pads are configured to attach the dielectric slab to an integrated circuit, e.g. the IC 200.

Any embodiment of the method 900 may include a step 940 in which the integrated circuit is joined to the dielectric slab via a plurality of solder bumps, e.g. the solder bumps 410. Any such embodiment may include a step 950 in which the via is conductively coupled to an antenna feed line located on the integrated circuit, e.g. the feed line 210 or 220. Any such embodiment may include a step 960 in which a plurality of ground bumps, e.g. the solder bumps 410 in the assemblies 610, are formed located adjacent the antenna feed line.

In any of the embodiments of the method 900, the antenna feed line may be a first antenna feed line and the via may be a first via. The method may further include a step 970 in which a second via is conductively connected to the antenna element is located within the dielectric slab. The first via may be located offset from a geometric center of the antenna element and about on a first axis of the antenna element. The second via may be located offset from the geometric center of the antenna element and about on a second orthogonal axis of the antenna element.

In any of the above embodiments of the method 900 the IC may include a substantially uninterrupted ground plane formed from a top level metal layer of the IC. In any of the embodiments of the method 900 the first major surface may be joined to a carrier substrate via an adhesion layer.

In any of the above-described embodiments of the method 900, the via may have an aspect ratio of at least about 2:1. In any embodiment, the dielectric slab may include a liquid crystal polymer. In any embodiment, the dielectric slab may have a thickness of about 100 µm. In any embodiment, forming the via may include laser ablation of the dielectric slab.

Those skilled in the art to which this application relates will appreciate that other and further additions, deletions, substitutions and modifications may be made to the described embodiments.

What is claimed is:

1. An apparatus, comprising:
    a dielectric slab having first and opposing second major outermost surfaces;
    a planar antenna element located on said first major outermost surface;
    first and second vias each located through said dielectric slab and extending from said first major outermost surface to said second major outermost surface and conductively connected to said planar antenna element;
    an integrated circuit joined to said dielectric slab via a plurality of solder bump pads located on said second outermost major surface and between said second major outermost surface and said integrated circuit, said integrated circuit having a ground plane located on an outermost surface thereof; and
    antenna feed lines located on said outermost surface of said integrated circuit and respectively connected to said planar antenna element by said first and second vias.

2. The apparatus as recited in claim 1, further comprising a plurality of ground bumps located adjacent said antenna feed line.

3. The apparatus as recited in claim 1, wherein said dielectric slab comprises a liquid crystal polymer.

4. The apparatus as recited in claim 1, wherein said via has an aspect ratio of at least about 2:1.

5. The apparatus as recited in claim 1, further comprising a substantially uninterrupted ground plane located on said second major outermost surface.

6. The apparatus as recited in claim 1, further comprising a carrier substrate joined to said first major outermost surface via an adhesion layer.

7. The apparatus as recited in claim 1, wherein said dielectric slab has a thickness of about 100 µm.

8. The apparatus as recited in claim 1, wherein said first via is located offset from a geometric center of said planar antenna element and about on a first axis of said planar antenna element, and said second via is located offset from said geometric center of said planar antenna element and about on a second orthogonal axis of said planar antenna element.

9. The apparatus as recited in claim 1, wherein said planar antenna element is configured to radiate in two orthogonal linearly-polarized modes.

10. The apparatus as recited in claim 1, wherein said planar antenna element is configured to produce circular polarized radiation.

11. A method comprising:
    forming a planar antenna element on a first major outermost surface of a dielectric slab;
    locating within said dielectric slab first and second vias conductively connected to said antenna element, and each of said first and second vias extending from said first major outermost surface to a second major outermost surface of said dielectric slab;
    forming a plurality of solder bump pads on said second major outermost surface, said solder bump pads being configured to attach said dielectric slab to an integrated circuit;
    joining said integrated circuit to said dielectric slab via, said plurality of solder bump pads located on said second major outermost surface and between said second major outermost surface and said integrated circuit, said integrated circuit having a ground plane located on an outermost surface thereof; and
    placing antenna feed lines on said outermost surface of said integrated circuit and connecting said antenna feed lines to said planar antenna element by said first and second vias.

12. The method as recited in claim 11, further comprising forming a plurality of ground bumps located adjacent said antenna feed lines.

13. The method as recited in claim 11, wherein said first via is located offset from a geometric center of said planar antenna element and about on a first axis of said planar antenna element, and said second via is located offset from said geometric center of said planar antenna element and about on a second orthogonal axis of said planar antenna element.

14. The method as recited in claim 11, further comprising a substantially uninterrupted ground plane located on said second major outermost surface.

15. The method as recited in claim 11, further comprising joining said first major outermost surface to a carrier substrate via an adhesion layer.

16. The method as recited in claim 11, wherein forming said first and second vias comprises laser ablation of said dielectric slab.

* * * * *